(12) United States Patent
Schumacher

(10) Patent No.: US 7,483,253 B2
(45) Date of Patent: Jan. 27, 2009

(54) SYSTEMS AND METHODS FOR DETECTING SOLENOID ARMATURE MOVEMENT

(75) Inventor: Joseph Wilfred Schumacher, East Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 157 days.

(21) Appl. No.: 11/442,143

(22) Filed: May 30, 2006

(65) Prior Publication Data
US 2007/0279047 A1    Dec. 6, 2007

(51) Int. Cl.
H01H 47/00 (2006.01)
(52) U.S. Cl. .................................................. 361/160
(58) Field of Classification Search ................. 361/152, 361/160, 195, 194, 170
See application file for complete search history.

(56) References Cited

U.S. PATENT DOCUMENTS

| | | | |
|---|---|---|---|
| 4,321,946 A | | 3/1982 | Paulos et al. |
| 4,545,530 A | | 10/1985 | Hofmann et al. |
| 4,950,985 A | | 8/1990 | Voss et al. |
| 5,255,152 A | * | 10/1993 | Estes et al. .................. 361/160 |
| 5,424,637 A | | 6/1995 | Oudyn et al. |
| 5,481,187 A | | 1/1996 | Marcott et al. |
| 5,578,904 A | | 11/1996 | Marcott et al. |
| 5,583,434 A | | 12/1996 | Moyers et al. |
| 5,600,237 A | | 2/1997 | Nippert |
| 5,650,909 A | | 7/1997 | Remele et al. |
| 5,668,476 A | | 9/1997 | Archer |
| 5,708,355 A | | 1/1998 | Schrey |
| 5,742,467 A | | 4/1998 | Schmitz |
| 5,784,245 A | | 7/1998 | Moraghan et al. |
| 5,812,355 A | * | 9/1998 | Nojima ........................ 361/152 |
| 5,942,892 A | | 8/1999 | Li |
| 5,991,143 A | | 11/1999 | Wright et al. |
| 6,017,017 A | | 1/2000 | Lutz et al. |
| 6,041,667 A | | 3/2000 | Pischinger et al. |

(Continued)

FOREIGN PATENT DOCUMENTS

EP    0 400 389 A2    12/1990

(Continued)

OTHER PUBLICATIONS

PCT International Search Report; PCT/US2007/007938; International Filing Date: Mar. 30, 2007; Applicant'File Ref. : 05-885; Applicant: Caterpillar Inc.

Primary Examiner—Michael J Sherry
Assistant Examiner—Nicholas Ieva
(74) Attorney, Agent, or Firm—Finnegan, Henderson, Farabow, Garrett & Dunner

(57) ABSTRACT

A method for detecting actuation of an armature associated with a solenoid includes providing a voltage potential to a solenoid coil associated with the solenoid. The method also includes measuring a current flowing through the solenoid coil. The method further includes switching the voltage potential off when the measured current reaches a predetermined maximum value. The method also includes switching the voltage potential on when the measured current reaches a predetermined minimum value. The method further includes measuring a time period between pulses associated with the switching on and off of the voltage potential. The method also includes comparing the measured time period between pulses with predetermined data indicative of an inductance growth level associated with the coil. The method further includes determining, based on the comparison, a pull-in time of an armature associated with the solenoid.

32 Claims, 7 Drawing Sheets

U.S. PATENT DOCUMENTS

| | | |
|---|---|---|
| 6,188,562 B1 | 2/2001 | Lutz et al. |
| 6,300,733 B1 | 10/2001 | Bergstrom |
| 6,518,748 B2 | 2/2003 | Butzmann et al. |
| 6,644,253 B2 | 11/2003 | Haskara et al. |
| 6,798,635 B2 | 9/2004 | Olsson |
| 6,895,997 B2 | 5/2005 | Qu et al. |
| 6,949,923 B2 | 9/2005 | Schultz et al. |
| 2002/0050898 A1 | 5/2002 | Olsson |
| 2003/0071613 A1 | 4/2003 | Schultz et al. |
| 2003/0107015 A1 | 6/2003 | Mianzo et al. |
| 2004/0016461 A1 | 1/2004 | Qu et al. |

FOREIGN PATENT DOCUMENTS

| | | |
|---|---|---|
| GB | 2 181 310 A | 4/1987 |

\* cited by examiner

SYSTEMS AND METHODS FOR DETECTING SOLENOID ARMATURE MOVEMENT

TECHNICAL FIELD

The present disclosure relates generally to armature position detectors and, more particularly, to systems and methods for detecting solenoid armature movement.

BACKGROUND

Solenoids are typically classified as any electromagnetic device that converts electrical energy to linear momentum. Solenoids may include a coil conductor wrapped around a metallic piston that serves as an armature. When voltage is applied to the coil terminals, current is passed through the coil conductor generating an electromagnetic field, which draws the metallic piston toward the field. An electronic controller may be coupled to the solenoid for regulating the flow of current through the coil conductor to control the electromagnetic field.

Position of the piston may be manipulated by controlling the strength of the electromagnetic field. For example, in order to initially actuate the solenoid armature, voltage may be applied across the coil conductor, energizing the coil and strengthening the electromagnetic field associated with the coil. When the electromagnetic force becomes strong enough to overcome the static kinetic forces associated with the armature, the armature is "pulled-in" toward the field. Once the armature has moved to the "pulled-in" position, current in the coil may be reduced to a minimum level required to hold the armature in place (i.e., "hold-in" current). To release the armature, thereby allowing its return to original (i.e., "rested") state, the current through the coil conductor may be cut-off, allowing the electromagnetic field to dissipate. Once the current level in the coil falls below the "hold-in" current, the electromagnetic forces acting on the armature are no longer sufficient to hold the armature in place, and the armature is returned to its rested state.

In certain situations, it may be beneficial to know when the armature is actuated. For example, in electronic fuel injection systems for combustion engines, fuel-efficient operation of the engine may depend on the precise operation of one or more solenoid valves. Effective determination of the operation of the solenoid valves may depend not only on the time in which the control signals are sent to the solenoid, but on the actuation time of solenoid armatures that may open and close the valves. Thus, a system and method for accurately determining armature movement time may be required.

At least one system has been developed to detect a "drop-off" condition associated with a magnetically operated device. For example, U.S. Pat. No. 6,188,562 ("the '562 patent"), which was issued to Lutz et al. on Feb. 13, 2001, describes a method and apparatus for recognizing an accidental closure of a solenoid valve. The system of the '562 patent is configured to monitor the frequency of a pulsed hold-in current and determine, based on an increase in the frequency, that an armature associated with the solenoid valve has accidentally dropped off, causing the valve to erroneously close.

Although the system of the '562 patent may determine an erroneous or accidental drop-off of a solenoid armature, it may be problematic. For example, because the system may only monitor the frequency of the pulsed signal that supplies the hold-in current to detect accidental drop-off, it may not determine when the actuator returns to its original position after the hold-in current has been turned off. As a result, systems requiring accurate detection of armature movement under normal operating conditions may become inefficient and inaccurate.

The presently disclosed systems and methods for detecting solenoid armature movement are directed to overcoming one or more of the problems set forth above.

SUMMARY OF THE INVENTION

In accordance with one aspect, the present disclosure is direct toward a method for detecting actuation of an armature associated with a solenoid. The method may include providing a voltage potential to a solenoid coil associated with the solenoid. The method may also include measuring a current flowing through the solenoid coil. The method may further include switching the voltage potential off when the measured current reaches a predetermined maximum value. The method may also include switching the voltage potential on when the measured current reaches a predetermined minimum value. The method may further include measuring a time period between pulses associated with the switching on and off of the voltage potential. The method may also include comparing the measured time period between pulses with predetermined data indicative of an inductance growth level associated with the coil. The method may further include determining, based on the comparison, a pull-in time of an armature associated with the solenoid.

According to another aspect, the present disclosure is directed toward a method for detecting drop-off of an armature associated with a solenoid. The method may include providing, after a hold-in current associated with a solenoid coil has been switched off, a pulsed test voltage to the solenoid coil. The method may also include measuring a current flowing through the solenoid coil. The method may further include switching the pulsed test voltage off when the measured current reaches a predetermined maximum value. The method may also include switching the pulsed test voltage on when the measured current reaches a predetermined minimum value. The method may further include measuring a time period between each pulse associated with the pulsed test voltage. The method may also include comparing the measured time period between pulses. The method may further include determining, based on the comparison, a drop-off time of an armature associated with the solenoid.

In accordance with yet another aspect, the present disclosure is directed toward an armature actuation detection system. The system may include a power supply selectively coupled to a solenoid coil via one or more switching elements and configured to provide a voltage output. The system may also include a controller operatively coupled to the one or more switching elements. The controller may be configured to operate the one or more switching elements to selectively provide a voltage potential to the solenoid coil. The controller may also be configured to measure a current flowing through the solenoid coil. The controller may be further configured to switch the voltage potential off when the measured current reaches a predetermined maximum value. The controller may also be configured to switch the voltage potential on when the measured current reaches a predetermined minimum value. The controller may be further configured to measure a time period between pulses of the voltage potential. The controller may also be configured to compare the measured time period between pulses with predetermined data indicative of a logarithmic growth characteristic associated with the solenoid coil. The controller may be further configured to determine, based on the comparison, a pull-in time of an armature associated with the solenoid.

According to another aspect, the present disclosure is directed toward an armature drop-off detection system. The system may include a power supply selectively coupled to a solenoid coil via one or more switching elements and configured to provide a voltage output. The system may also include a controller operatively coupled to the one or more switching elements. The controller may be configured to operate, after a hold-in current associated with a solenoid coil has been switched off, the one or more switching elements to selectively provide a pulsed test voltage to the solenoid coil. The controller may also be configured to measure a current flowing through the solenoid coil. The controller may further be configured to switch the pulsed test voltage off when the measured current reaches a predetermined maximum value. The controller may also be configured to switch the pulsed test voltage on when the measured current reaches a predetermined minimum value. The controller may further be configured to measure a time period between each pulse associated with the pulsed test voltage. The controller may also be configured to compare the measured time period between pulses. The controller may further be configured to determine, based on the comparison, a drop-off time of an armature associated with the solenoid.

In accordance with yet another aspect, the present disclosure is directed toward a machine having a solenoid including a conductor and an armature, wherein the conductor is coiled substantially around the armature in a longitudinal direction and separated from the armature via an air gap, the armature being adapted to move relative to the conductor in the presence of an electromagnetic field generated by the conductor. The machine may further include an armature drop-off system operatively coupled to the solenoid. The armature drop-off system may include a power supply selectively coupled to the solenoid conductor via one or more switching elements and configured to provide a voltage output. The armature drop-off system may also include a controller operatively coupled to the one or more switching elements. The controller may be configured to operate, after an energizing current associated with a solenoid conductor has been switched off, the one or more switching elements to selectively provide a pulsed test voltage to the solenoid conductor. The controller may also be configured to measure a current flowing through the solenoid conductor. The controller may further be configured to switch the pulsed test voltage off when the measured current reaches a predetermined maximum value. The controller may also be configured to switch the pulsed test voltage on when the measured current reaches a predetermined minimum value. The controller may further be configured to measure a time period between each pulse associated with the pulsed test voltage. The controller may also be configured to compare the measured time period between pulses. The controller may further be configured to determine, based on the comparison, a drop-off time of an armature associated with the solenoid.

According to another aspect, the present disclosure may be directed toward a machine having a solenoid including a conductor and an armature, wherein the conductor is coiled substantially around the armature in a longitudinal direction and separated from the armature via an air gap, the armature being adapted to move relative to the conductor in the presence of an electromagnetic field generated by the conductor. The machine may include an armature actuation detection system operatively coupled to the solenoid. The armature actuation detection system may include a power supply selectively coupled to a solenoid conductor via one or more switching elements and configured to provide a voltage output. The armature actuation detection system may also include a controller operatively coupled to the one or more switching elements. The controller may be configured to operate the one, or more switching elements to selectively provide a voltage potential to the solenoid conductor. The controller may also be configured to measure a current flowing through the solenoid conductor. The controller may further be configured to switch the voltage potential off when the measured current reaches a predetermined maximum value. The controller may also be configured to switch the voltage potential on when the measured current reaches a predetermined minimum value. The controller may further be configured to measure a time period between pulses of the voltage potential. The controller may also be configured to compare the measured time period between pulses with predetermined data indicative of a logarithmic growth characteristic associated with the solenoid conductor. The controller may further be configured to determine, based on the comparison, a pull-in time of an armature associated with the solenoid.

DETAILED DESCRIPTION

Figure 1:
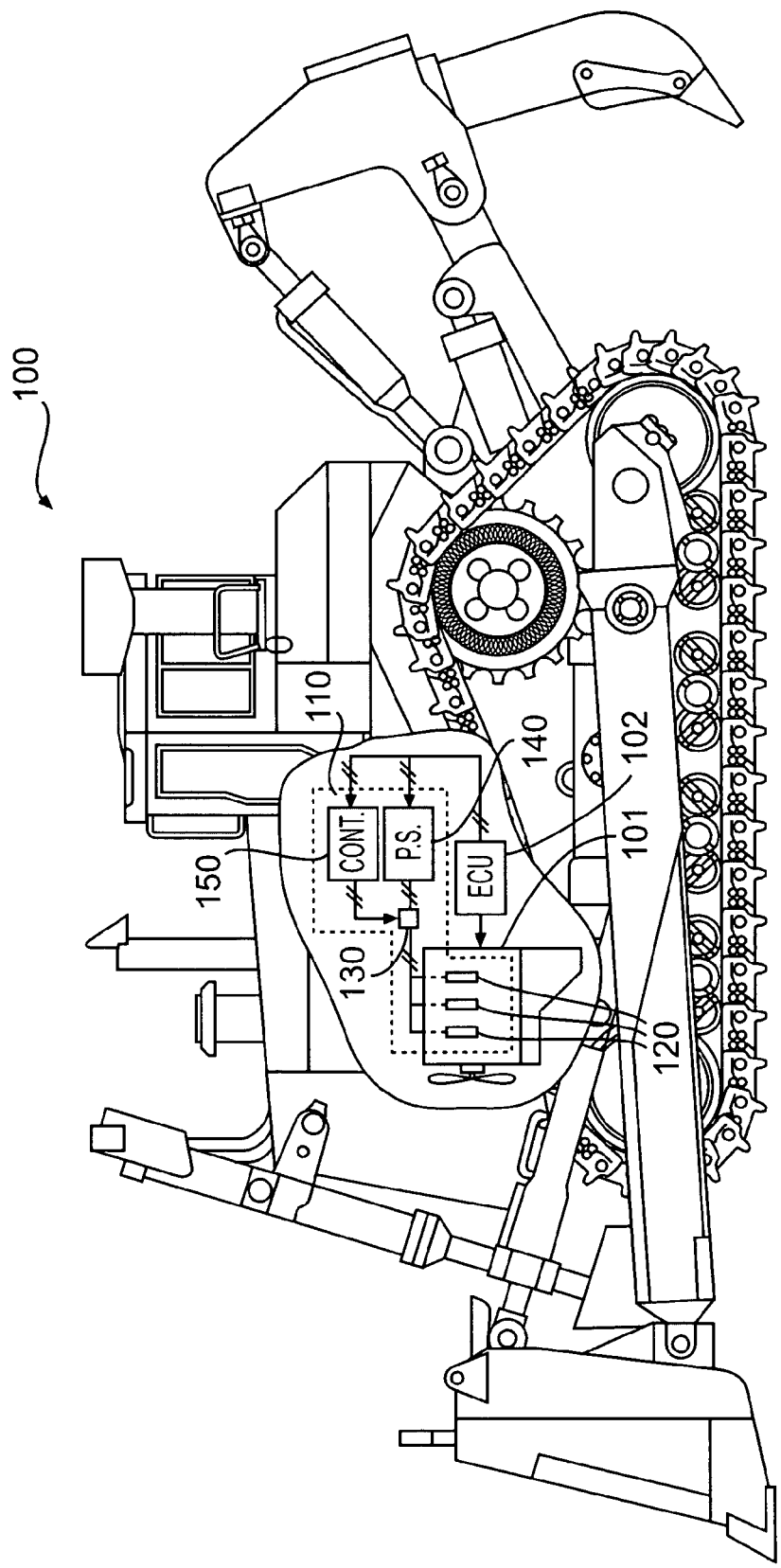
FIG. 1 provides a diagrammatic illustration depicting an exemplary machine in accordance with certain disclosed embodiments.

FIG. 1 provides a diagrammatic illustration of an exemplary machine 100 according to certain disclosed embodiments. Machine 100 may include any fixed or mobile machine for performing a task associated with an industry such as mining, construction, farming, transportation, power generation, manufacturing, and any other type of industry. Non-limiting examples of fixed machines include engine systems, turbines, power generators, stationary drill equipment (e.g., for an off-shore drill platform), and any other types of fixed machines. Non-limiting examples of mobile machines include cranes, haulers, front end loaders, tractors, on and off-highway vehicles, automobiles, excavators, dump trucks, or any other suitable mobile machine. Machine 100 may include, among other things, a power source 101 for producing a power output, an electronic control unit (ECU) 102, one or more solenoids 120 configured to perform at least one task associated with machine 100, and a system 110 for detecting movement of an armature associated with solenoid 120. Although machine 100 is illustrated as a track-type tractor machine, it is contemplated that machine 100 may include any suitable type of mobile or fixed machine, such as those described above.

Power source 101 may include any device configured to output energy for use by machine 100. For example, power source 101 may include a combustion engine configured to operate on diesel fuel, gasoline, natural gas, or any other type of fuel. Alternatively and/or additionally, power source 101 may include any type of device configured to output electrical and/or mechanical energy such as, for example, a fuel cell, a generator, a battery, a turbine, an alternator, a transformer, or any other appropriate power output device.

ECU 102 may be coupled to a plurality of subsystems and components associated with machine 100 and configured to monitor and control operations associated with these systems and components. For example, ECU 102 may be operatively coupled to power source 101 and configured to control operations associated with subsystems and components associated with power source 101. Alternatively and/or additionally, ECU 102 may be communicatively coupled to system 110 and configured to monitor and control the operation of one or more solenoids 120 of machine 100. Although ECU 102 is illustrated as a control unit for machine 100, ECU 102 may include any type of control system such as, for example, a powertrain control module (PCM) associated with an automobile, a controller associated with a piece of manufacturing equipment, or any other suitable system that may be adapted to monitor and/or control an operational aspect associated with machine 100.

One or more solenoids 120 may each include an electromechanical transducer configured to convert electrical energy to linear momentum for actuating at least one mechanical device associated with machine 100. For example, solenoid 120 may be configured as an electromechanical valve, relay, switch, or other suitable device that may be configured to provide mechanical output power based on an electrical power input. For example, solenoid 120 may include one or more valves configured to regulate the flow of fuel to a combustion chamber. Alternatively, solenoid 120 may include a starter motor switch configured to facilitate a current flow to energize a starter motor associated with machine 100. Alternatively and/or additionally, it is contemplated that one or more solenoids 120 may be implemented in any application associated with machine 100 where electronic control of mechanical actuators may be required.

Figure 2:
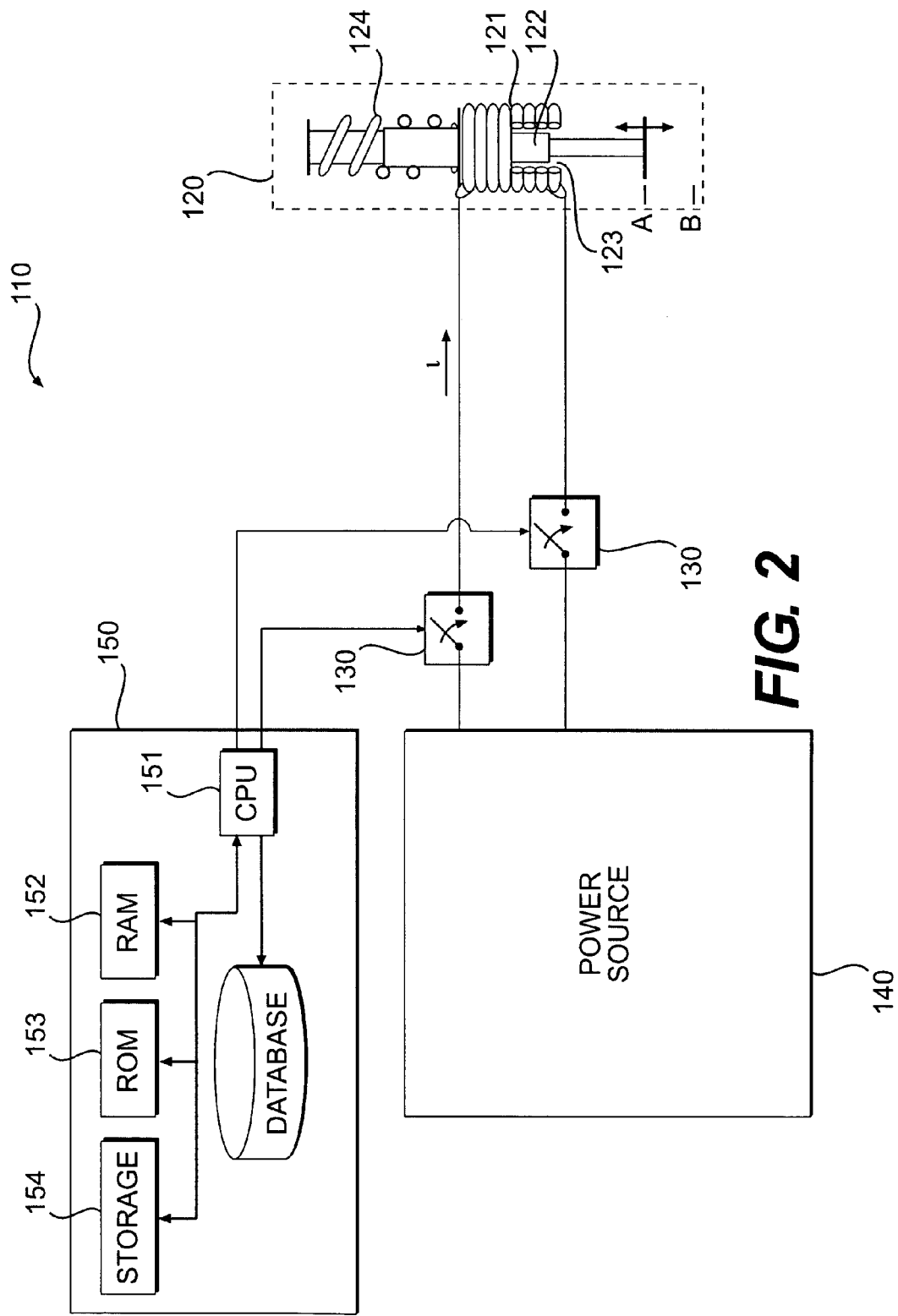
FIG. 2 provides a block diagram illustration of an exemplary armature movement detection system in accordance with the disclosed embodiments.

As illustrated in FIG. 2, solenoid 120 may include one or more components configured to receive electrical power input and provide mechanical power output in response to the power input. For example, solenoid 120 may include a solenoid coil 121 selectively coupled to an armature 122 and separated from armature 122 via air gap 123. Solenoid 120 may also include a positioner 124 for positioning armature 122 in an initial (or original) state (denoted by position "A") when no electromagnetic field is present within air gap 123.

Solenoid coil 121 may include any type of metallic conductor and may be configured in a substantially coiled arrangement. This coiled arrangement may facilitate the induction of an electromagnetic field substantially around the coil, with the strongest field contained within the area associated with a perimeter created by the coil. Solenoid coil 121 may include copper, aluminum, steel, nickel, iron or any other suitable metallic or metallic-alloy wire that may be used to induce a magnetic field associated with a passage of current through the wire.

Armature 122 may be disposed substantially longitudinally within the coiled conductor and configured to move relative to solenoid coil 121 in the presence of an electromagnetic field generated by a current passing through the coil. For example, armature 122 may be configured to move from an original position "A" to a "pulled-in" position "B" in the presence of an electromagnetic field provided by solenoid coil 121. Movement of armature 122 may be proportional to the strength of the electromagnetic field and may be substantially in the direction of flow of current through the solenoid coil 121. Armature 122 may be constructed of any high magnetic permeability material such as, for example, iron, nickel, cobalt, or any other suitable high-permeability metal or metal-alloy.

As illustrated in FIG. 2, solenoid 120 may be selectively coupled to a system 110 for detecting armature movement. System 110 may include one or more components configured to control operations solenoid 120, monitor one or more operational aspects associated with solenoid 120, and determine when armature 122 associated with solenoid 120 has changed positions. System 110 may include, among other things, a power supply 140 selectively coupled to solenoid 120 via one or more switching elements 130 and a controller 150 for monitoring and controlling operations of system 110.

Power supply 140 may include any device for providing an electrical power output for use by solenoid 120. Power supply 140 may include, for example, a generator, an alternator, a battery, a fuel cell, a transformer, a power converter, or any other suitable device for providing AC or DC power for use by solenoid 120. Power supply 140 may constitute a standalone source of electrical power configured to provide power to multiple electrical systems or components associated with machine 100. Alternatively, power supply 140 may be included within controller 150 as an integrated unit dedicated exclusively for use by controller 150.

Switching elements 130 may include one or more components configured to selectively couple power supply 140 to solenoid 120. Switching elements 130 may include any type of mechanical or electrical switch such as, for example, a solid-state transistor type switch (e.g., FET switch, BJT switch, CMOS switch, IGBT switch, etc.), a relay device, a circuit breaker or any other device suitable for selectively coupling power supply 140 to solenoid 120. Switching elements 130 may be electronically operated by a control unit, such as ECU 102 or controller 150.

Controller 150 may include any type of processor-based system on which processes and methods consistent with the disclosed embodiments may be implemented. Controller 150 may include one or more hardware components such as, for example, a central processing unit (CPU) 151, a random access memory (RAM) module 152, a read-only memory (ROM) module 153, a storage 154, and a database 155. Alternatively and/or additionally, controller 150 may include one or more software components such as, for example, a computer-readable medium including computer-executable instructions for performing methods consistent with certain disclosed embodiments. It is contemplated that one or more of the hardware components listed above may be implemented using software. For example, storage 154 may include a software partition associated with one or more other hardware components of controller 150. Controller 150 may include additional, fewer, and/or different components than those listed above. It is understood that the components listed above are exemplary only and not intended to be limiting.

CPU 151 may include one or more processors, each configured to execute instructions and process data to perform one or more functions associated with controller 150. As illustrated in FIG. 2, CPU 151 may be communicatively coupled to RAM 152, ROM 153, storage 154, and database 155. CPU 151 may be configured to execute sequences of computer program instructions to perform various processes, which will be described in detail below. The computer program instructions may be loaded into RAM 152 for execution by CPU 151.

RAM 152 and ROM 153 may each include one or more devices for storing information associated with an operation of controller 150 and/or CPU 151. For example, ROM 153 may include a memory device configured to access and store information associated with controller 150, including information for identifying, initializing, and monitoring the operation of one or more components and subsystems of controller 150. RAM 152 may include a memory device for storing data associated with one or more operations of CPU 151. For example, ROM 153 may load instructions into RAM 152 for execution by CPU 151.

Storage 154 may include any type of mass storage device configured to store information that CPU 151 may need to perform processes consistent with the disclosed embodiments. For example, storage 154 may include one or more magnetic and/or optical disk devices, such as hard drives, CD-ROMs, DVD-ROMs, or any other type of mass media device.

Database 155 may include one or more soft-ware and/or hardware components that cooperate to store, organize, sort, filter, and/or arrange data used by controller 150 and/or CPU 151. For example, database 155 may include one or more predetermined threshold levels associated with current maximum and minimums associated with various operational states of solenoid 120. For example, database 155 may include one set of current maximum and minimum threshold levels associated with a pull-in state of operation. Additionally, database 155 may include a second set of current maximums and minimum threshold levels associated with a hold-in state of operation. Database 155 may also include a third set or current maximum and minimum threshold levels associated with a drop-off state of operation. Each of these operational states will be described in greater detail below. CPU 151 may access the information stored in database 155 for comparing a measured solenoid coil current with one or more of the threshold levels to determine if/when to operate one or more switching elements 130 associated with system 110. It is contemplated that database 155 may store additional and/or different information than that listed above.

Controller 150 may be communicatively coupled to switching elements 130 and configured to operate each of switching elements 130. Controller 150 may operate switching elements 130 based on a desired operation of solenoid 120. For example, controller 150 may operate switching elements 130 to pulse the energy provided by power supply 140 to solenoid coil 121, thereby providing a variable current flow through solenoid coil to generate a magnetic field for actuating armature 122. Controller 150 may be configured to manipulate this variable current flow by sequentially operating one or more switching elements 130 to produce an electromagnetic field associated with solenoid 120 based on a desired operation of solenoid 120.

Controller 150 may also be communicatively coupled to power supply 140 to control a power level of a power output associated with power supply 140. For example, for a pull-in state associated with solenoid 120, controller 150 set a power level associated with power supply 140 to a first power level. Once pull-in has been achieved, controller 150 may vary the power level based on a desired operation of solenoid 120. In addition to power level, controller 150 may be configured to adjust other operational aspects associated with power supply 140 such as, for example, frequency, waveform, etc.

Controller 150 may be configured to monitor one or more operational aspects associated with system 110. For example, controller 150 may include one or more monitoring devices (not shown) operatively coupled to a portion of system 110. These monitoring devices may include one or more current and/or voltage sampling devices configured to monitor a current or voltage level associated with solenoid coil 121, a timing counter configured to monitor a time between operation of the one or more switching elements 130, or any other suitable device for monitoring an operational aspect associated with system 110.

Controller 150 may be configured to operate one or more switching elements 130 and/or power supply 140 to energize solenoid coil 121 based on a desired operation of solenoid 120. For example, at an initial time, controller 150 may place one or more switching elements 130 in an "off" state, corresponding to a state where the switching element is not conducting current. As a result, the circuit providing the current flow path through solenoid coil 121 may be open, preventing current flow and, therefore, preventing an induction of a magnetic field associated with solenoid coil 121. Without the presence of a magnetic force, solenoid armature 122 may be held in rested in an initial state "A" by positioner 124, which may include an electrical or mechanical element, such as a spring, a magnet, or any other type of element for holding and/or returning armature 122 to initial state "A."

It is contemplated that, in addition to placing one or more switching elements 130 in an "off" state, thereby preventing current flow between power supply 140 and solenoid 120, controller 150 may, controller 150 may place one or more switching elements in a "reduced" state, thereby reducing and/or minimizing the current flow to a predetermined level. Thus, it is contemplated that placing one or more switching elements 130 in an "off" state refers to any activity that substantially reduces the current flow from a first state to a second state wherein the electromagnetic field induced by the solenoid coil is allowed to dissipate.

Figure 3:
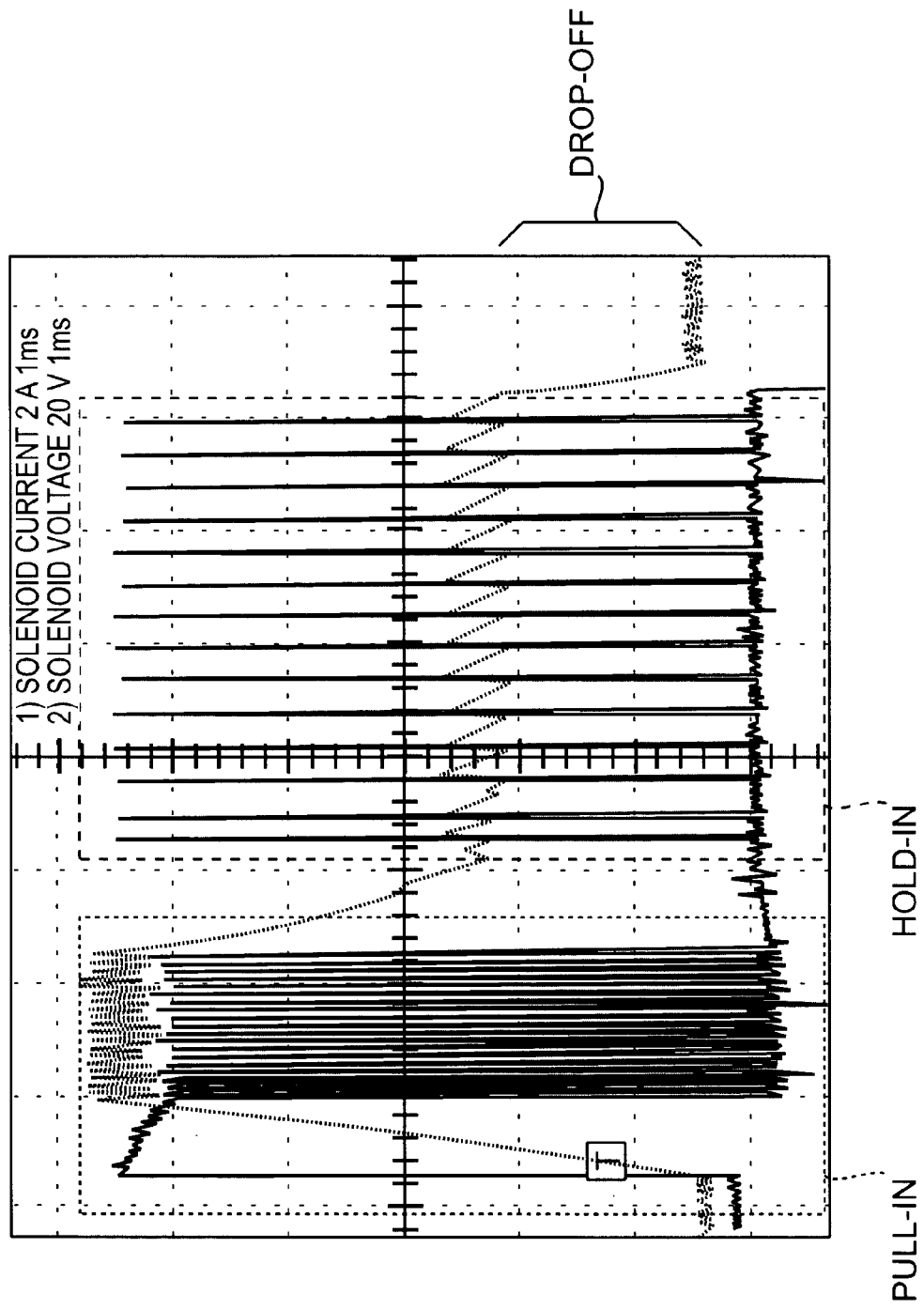
FIG. 3 provides a graph illustrating solenoid coil voltage and current with respect to time in accordance with the disclosed embodiments.

FIG. 3 provides current and voltage flow illustrations associated with solenoid coil 121 during an exemplary operation of solenoid 120. As illustrated in FIG. 3, controller 150 may initiate operation of solenoid 120 by placing each of switching elements 130 lying in the solenoid circuit in an "on" state, enabling the flow of energy between power supply 140 and solenoid 120 through solenoid coil 121. In addition to placing switching elements 130 "on", controller 150 may set power supply maximum and minimum voltage levels based on predetermined pull-in voltage associated with solenoid 120. This pull-in voltage may include a minimum voltage level required to provide solenoid coil 121 with a current level large enough to induce a magnetic field with enough force to "pull" armature 122 from its initial position "A" to a pulled-in position "B".

Due to the inductive nature of solenoid coil 121, controller 150 may be configured to sequentially pulse one or more switching elements 130 off and on in order to provide the variable current that may be required to induce the magnetic field. Controller 150 may pulse this voltage at a predetermined frequency. Alternatively, according to one embodiment, controller 150 may initially energize the current to a maximum current level. Once the solenoid coil current reaches this maximum level, controller 150 may place one or more switching devices 130 in an off state, allowing some of the current stored in solenoid coil 121 to dissipate. When the current dissipates to a minimum threshold level, controller 150 may place the switches in the on state, thereby enabling current to re-charge solenoid coil 121.

Once the current in the coil has induced a magnetic field strong enough to overcome the initial force, armature 122 may actuate by moving from position "A" to position "B". It should be noted that the movement of armature 122 from position "A" to position "B" may result in a change in the inductance associated with solenoid coil 121. As a result of this change, the armature movement may induce a small current that acts in the opposite direction of the current induced by the application of pull-in voltage. This negative current flow may cause an increase in the time required for the solenoid coil current to reach its maximum threshold value.

Once armature 122 has been successfully pulled in, controller 150 may set the maximum and minimum voltage levels associated with power supply 140 to a predetermined hold-in value. Because less energy may be required to hold armature 122 in position "B" than was required to pull-in armature 122, the hold-in value may include a minimum voltage level that is considerably less than the pull-in voltage level. This hold-in value may correspond to a minimum voltage level required to provide solenoid coil 121 with a current that induces a magnetic field with enough force to hold armature in position "B".

To release armature 122 and allow it to return to its original state (i.e., position "A"), controller 150 may place one or more switching devices 130 in the "off" state, and allow the current associated with solenoid coil 121 to fall below the hold-in value. As the current associated with solenoid coil 121 dissipates, the electromagnetic field induced by the current weakens until the initial force (as provided by positioner 124) overcomes the force of the electromagnetic field that holds armature 122 at hold-in position "B", allowing armature 122 to "drop-off" and return to position "A". The movement of armature 122 from position "B" to its original position "A" may result in a change in the inductance of solenoid coil 121. This change may induce a supplemental current within solenoid coil 121, which may flow in the same direction as the current induced by the application of the pull-in current. This positive current flow may increase the time that may be required for the current to dissipate from solenoid coil 121.

Figure 4:
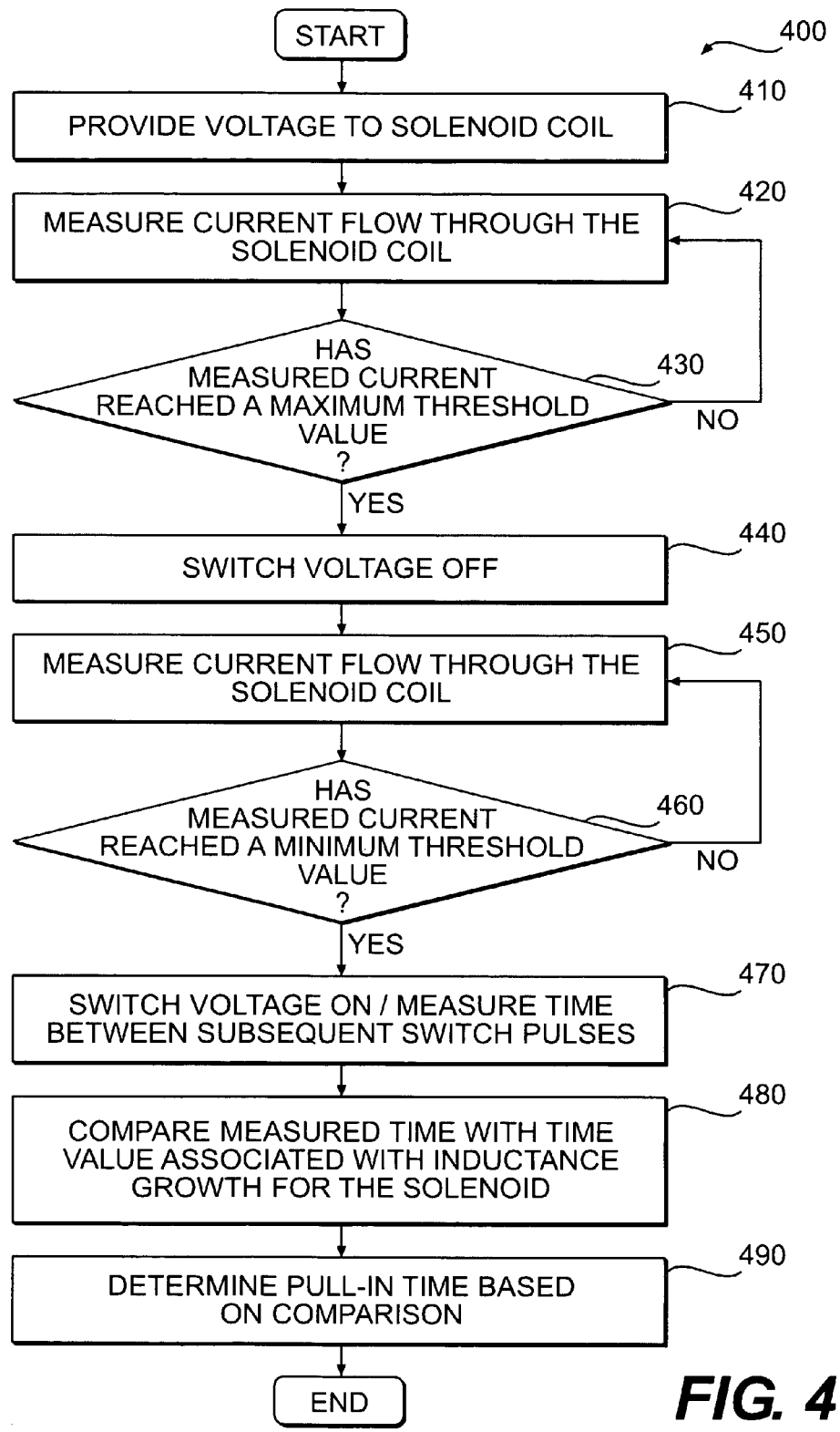
FIG. 4 provides a flowchart depicting an exemplary method for detecting actuation of a solenoid armature consistent with certain disclosed embodiments.

Processes and methods consistent with the disclosed embodiments may enable systems that rely on precise control of solenoids 120 to accurately determine when armature 122 actuates (i.e., when armature 122 "pulls-in" and "drops-off"). FIG. 4, provides a flowchart 400 illustrating an exemplary method for operating system 110 associated with controller 150.

As illustrated in FIG. 4, the method include providing voltage to solenoid coil 121 associated with solenoid 120 (Step 410). For example, controller 150 may adjust the maximum and minimum voltage threshold levels to provide the appropriate pull-in voltage to solenoids coil 121 and place switching elements 130 in the "on" state. As a result, the pull-in voltage may be applied across solenoide coil 121, enabling current flow therethrough.

Once voltage has been provided to solenoide coil 121, the current flowing through solenoid coil 121 may be measured (Step 420). For example, controller 150 may include one or more current monitoring devices configured to automatically monitor the current flow associated with solenoid coil 121. Controller 150 may be configured to continuously monitor the solenoid coil current. Alternatively, controller 150 may sample the solenoid coil current periodically, based on a predetermined sampling rate.

Controller 150 may compare the measured current associated with solenoid coil 121 to a maximum current threshold value (Step 430). For example, CPU 151 of controller 150 may compare the measured current with a predetermined maximum current threshold value stored in database 155. If the solenoid coil current has not reached this maximum threshold value, controller 150 may continue monitoring the coil current (Step 430: No). Alternatively, if the solenoid coil current has reached the maximum threshold value, controller 150 may place one or more switching devices in the "off" state, thereby cutting off the supply voltage to solenoid coil 121 and allowing the solenoid coil current to dissipate (Step 440).

While the solenoid coil current dissipates, controller 150 may measure the solenoid coil current (Step 450) and compare the measured current to a minimum threshold value (Step 460). For example, CPU 151 associated with controller 150 may compare the measured solenoid coil current with a predetermined minimum threshold value stored in database 155. If the solenoid coil current has not dissipated to a minimum threshold level, controller 150 may continue measuring the current flow through solenoid coil 121 (Step 460: No).

Alternatively, if the solenoid coil current has dissipated to a minimum threshold level (Step 460: Yes), controller 150 may place switching devices 130 in the "on" state and measure the time between the switching on and off of switching devices 130 (Step 470). For example, CPU 151 associated with controller 150 may provide control signals to turn on switching devices 130. CPU 151 may also measure the time elapsed between the switching on and switching off of switching devices 130 in subsequent operations of switching devices 130. CPU 151 may store the measured time in storage 154 for future analysis.

Figure 5:
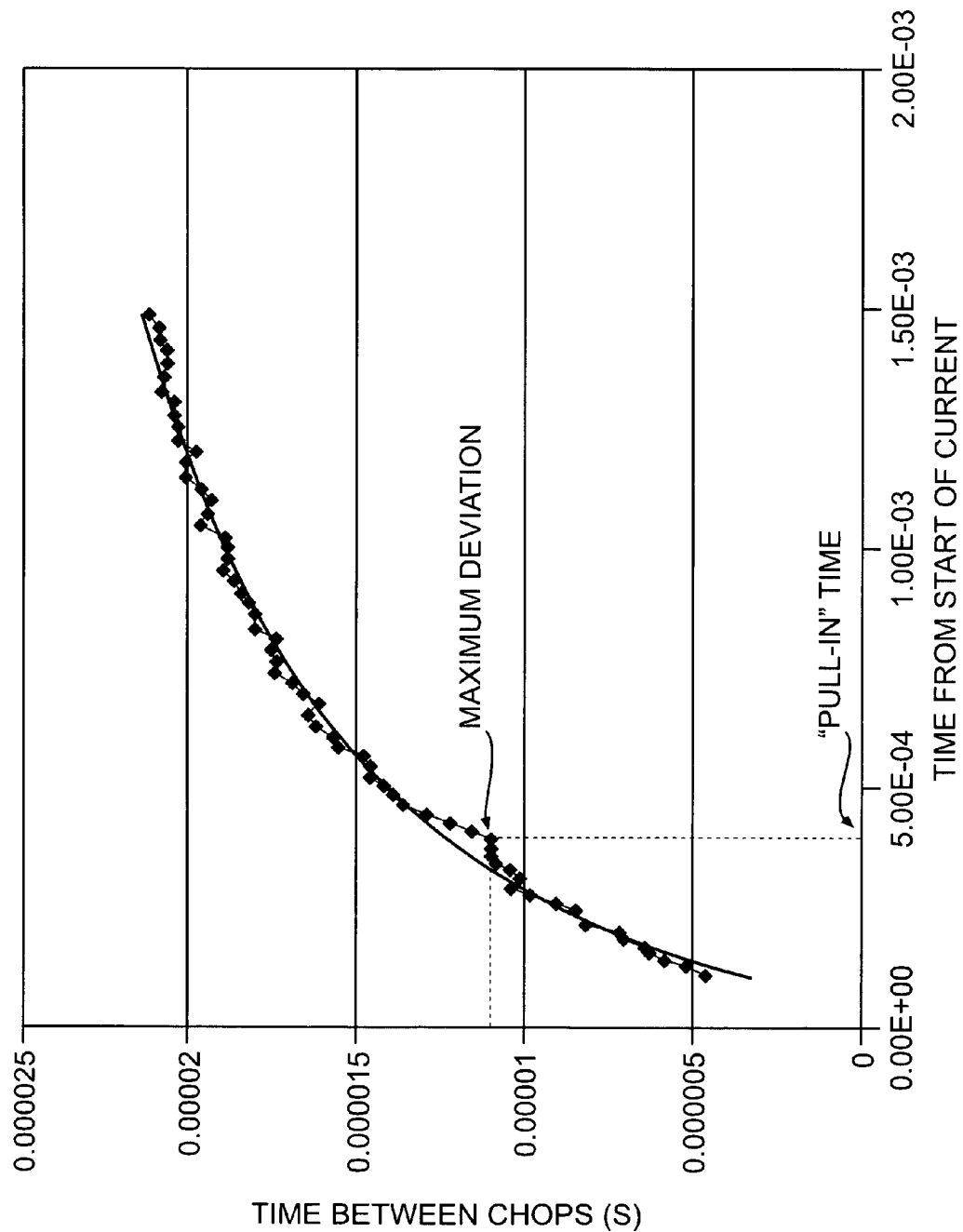
FIG. 5 provides an graph illustrating measured time between pulses compared to a logarithmic growth curve associated with a solenoid.

Once the time between the pulsing one and off of the voltage associated with solenoid coil 121 has been measured, controller 150 may compare this time with an inductance growth value associated with the corresponding pulse (Step 480). For example, controller 150 may compare a plurality of time values between pulses with an ideal plot of inductance of solenoid coil 121 with respect to time. Because the amount of time between pulses is directly proportional to the inductance of solenoid coil 121, the measured time between pulses should correspond closely with the inductance growth. For instance, FIG. 5, which provides a plot of the time between voltage pulses (i.e., time between the switching on and off of switching devices 130) versus time, illustrates that the measured time between pulses (denoted by the bulleted line) generally corresponds to the inductance associated with solenoid coil 121. At each particular time from when first pulse was applied, controller 150 may compare the ideal inductance value with the measured time between pulses.

Once the measured time between pulses has been compared with the inductance growth value(s), controller 150 may determine the pull-time time of armature 122 associated with solenoid 120 (Step 490). According to one embodiment, controller 150 may compare a plurality of time between pulses with the ideal inductance curve associated with solenoid coil 121 on a graphical plot, such as that illustrated in FIG. 5. The pull-in time may be selected as the time in which deviation of the measured time between pulses from the ideal inductance curve is greatest. According to another embodiment, controller 150 may compare the measured time between pulses with a predetermined deviation threshold, which may be selected based on analysis of previous results or empirical data collected from experimental results. If the measured time between pulses, when compared to a corresponding inductance value, exceeds the predetermined deviation threshold, controller 150 may determine that armature pull-in occurred during that measured time period.

Figure 6:
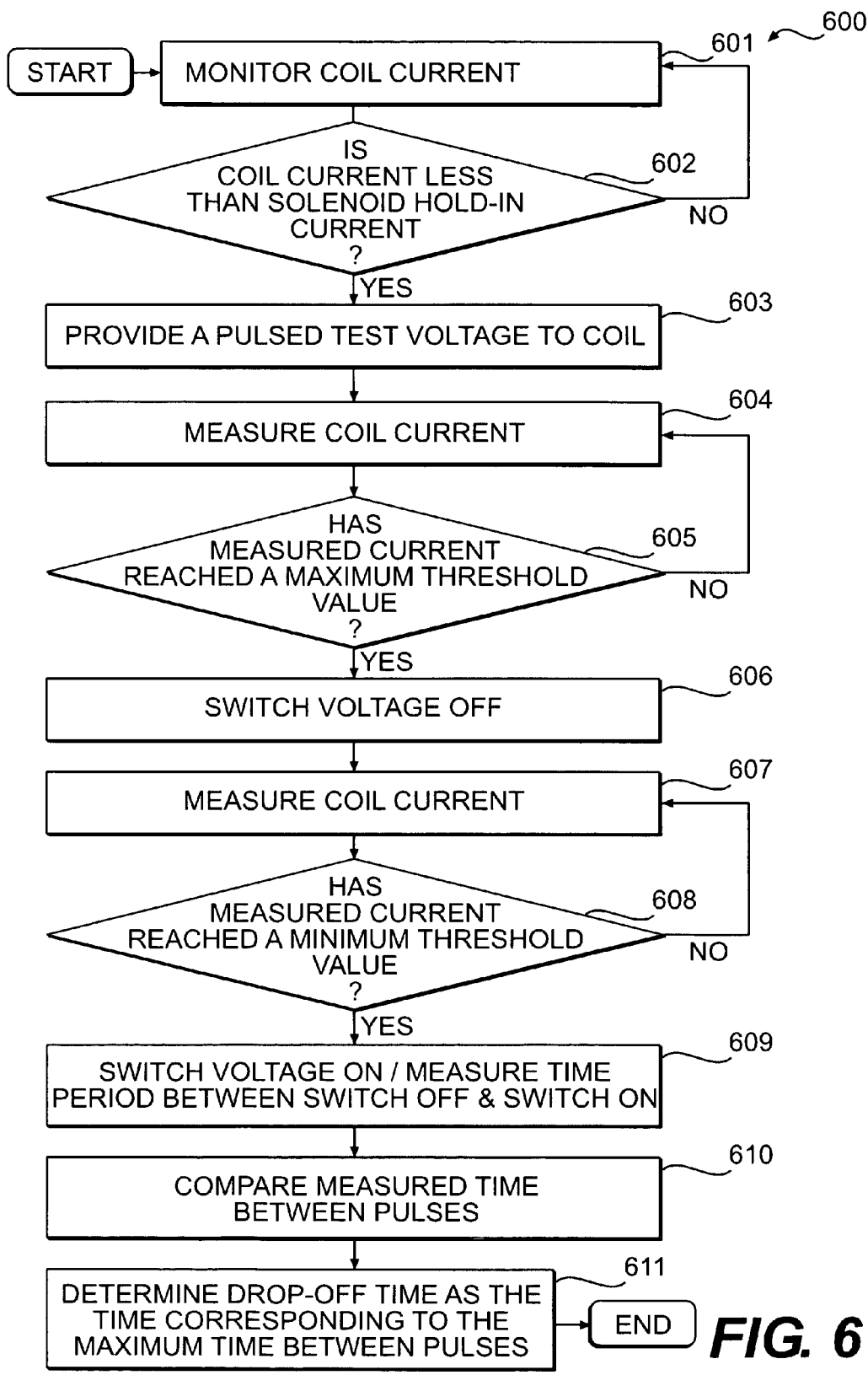
FIG. 6 provides a flowchart depicting an exemplary method for detecting drop-off of a solenoid armature consistent with certain disclosed embodiments.

According to another aspect and in addition to detecting a pull-in time associated with armature 122, system 110 may detect a drop-off time of an armature 122 associated with solenoid 120. Drop-off time may be determined after the current associated with solenoid coil 121 has dissipated below the hold-in current. FIG. 6 illustrates a flowchart 600 depicting an exemplary method of operation for system 110 to determine a drop-off time of an actuator 122. As illustrated in FIG. 6, controller 150 may pulse the voltage applied to solenoide coil 121 off by switching off one or more switching devices 130, allowing the current associated with solenoid coil 121 to dissipate. Controller 150 may monitor a current associated with solenoid coil 121 as the solenoid coil current dissipates (Step 601).

Controller 150 may compare the monitored solenoid coil current with a minimum current threshold level (Step 602). For example, CPU 151 associated with controller 150 may compare the monitored current with a predetermined minimum threshold level stored in database 155. This threshold level may include a predetermined value that is set to some level less than a corresponding maximum value, both of which are set to a level less than the hold-in current level. If the solenoid coil current has not reached the minimum threshold level (Step 602: No), controller 150 may continue to monitor the current associated with solenoide coil 121.

Alternatively, once the solenoid coil current has reached a minimum threshold level, controller 150 may operate one or more switching devices 130 to provide a test voltage to solenoid coil 121 (Step 603). For example, controller 150 may adjust power supply 140 to a test voltage level, wherein the maximum amplitude of the test voltage level is below the hold-in voltage level. Controller 150 may then place switching devices in the "on" state, thereby coupling power supply 140 to solenoid coil 121.

Once the test voltage has been applied to solenoid coil 121, controller may measure the current associated with the applied voltage (Step 604). The measured current may be compared with a maximum threshold level, which has been set to a level less than a hold-in current level. If the current level has not reached the maximum threshold level (Step 605: No), controller 150 may continue to measure the solenoid coil current.

Alternatively, if measured solenoid coil current has reached the maximum threshold level (Step 605: Yes), controller 150 may turn one or more switching devices 130 off (Step 606), thereby allowing the solenoid coil current to dissipate. As the current associated with solenoid coil 121 dissipates, controller 150 may measure solenoid coil current (Step 607) to determine if the measured current has reached the predetermined minimum threshold value (Step 608). If the current has not reached the predetermined threshold value (Step 608: No), controller 150 may continue monitoring solenoid coil current.

If, however, solenoid coil current has reached the minimum threshold value (Step 608: Yes), the voltage may be pulsed on and the time between the pulsing of switching devices off and on may be measured (Step 609). For example, controller 150 may include a timing counter that records the time interval between operations of switching elements 130. These time intervals may be stored in storage 154 for future use and/or analysis.

Figure 7:
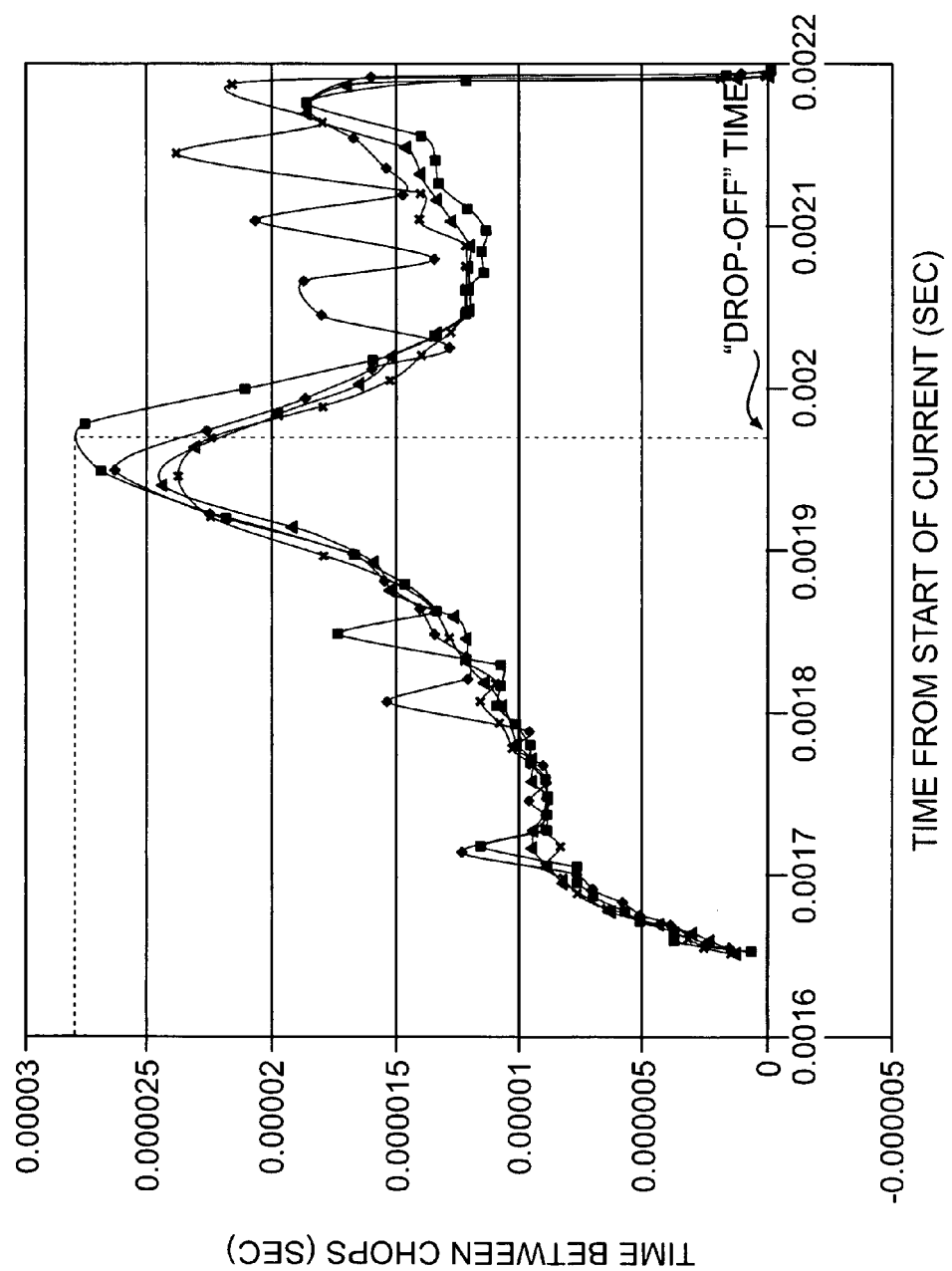
FIG. 7 provides a graph illustrating measured time between voltage pulses with respect to time associated with a drop-off of a solenoid.

The process of pulsing the test voltage on and off may be continued until substantially all of the current associated with solenoide coil 121 has been dissipated. Once the current has dissipated, controller 150 may compare the measured time period between each of test voltage pulses (Step 610). Controller 150 may then determine the drop-off time as the time corresponding with the maximum time between pulses, selected from among all of the measured time periods (Step 611). For example, as illustrated in FIG. 7, which provides a graph displaying the measured time between pulses for a plurality of operations associated with solenoid 120, drop-off occurs when the measured time between pulses reaches a maximum. As indicated above, this time peak corresponds to the increased time required to dissipate the supplemental current induced by the magnetic field change due to the drop-off of armature 122.

INDUSTRIAL APPLICABILITY

The disclosed armature movement detection system may be applicable to any system where accurate and reliable determination of armature movement in electromagnetic transducers may be advantageous. Specifically, the disclosed armature movement detection system may provide a method for determining a pull-in time and drop-off time of a solenoid actuator, both of which may be critical in systems that rely on the precision control of solenoid operations.

The presently disclosed armature movement detection system may provide several advantages. For example, system 110 may be configured to determine a drop-off time associated with a solenoid armature after the hold-in voltage has been cut-off. As a result, a pulsed test voltage may be applied to solenoid 120, enabling system 110 to more accurately determine the drop-off time associated armature 122 than conventional systems that monitor current variations in solenoid coil, which may be difficult to detect.

In addition, the presently disclosed armature movement detection system may enhance control capabilities of systems associated with machine 100. For example, the ability to determine both pull-in time and drop-off time may enable system 110 to more accurately control the actuation of armature 122, by allowing the system to account for any lag in armature movement due to the buildup of the magnetic field. As a result, systems that rely on precise control of armature actuation (such as fuel injection systems, for example) may become more efficient.

It will be apparent to those skilled in the art that various modifications and variations can be made to the disclosed solenoid armature movement detection system without departing from the scope of the invention. Other embodiments of the present disclosure will be apparent to those skilled in the art from consideration of the specification and practice of the present disclosure. It is intended that the specification and examples be considered as exemplary only, with a true scope of the present disclosure being indicated by the following claims and their equivalents.

What is claimed is:

1. A method for detecting actuation of an armature associated with a solenoid, comprising:
   providing a voltage potential to a solenoid coil associated with the solenoid;
   measuring a current flowing through the solenoid coil;
   switching the voltage potential off when the measured current reaches a predetermined maximum value;
   switching the voltage potential on when the measured current reaches a predetermined minimum value;
   measuring a time period between pulses associated with the switching on and off of the voltage potential;
   comparing the measured time period between pulses with predetermined data indicative of an inductance growth level associated with the coil; and
   determining, based on the comparison, a pull-in time of an armature associated with the solenoid.

2. The method of claim 1, wherein the predetermined data includes a logarithmic growth characteristic associated with the solenoid coil.

3. The method of claim 2, wherein the logarithmic growth characteristic includes an inductance associated with the solenoid coil.

4. The method of claim 1, wherein the determination further includes identifying the pull-in time as a time indicative of a maximum deviation of the measured time period between pulses with respect to the predetermined data.

5. The method of claim 1, wherein measuring the time period between pulses includes measuring the time between switching the voltage potential on and switching the voltage potential off.

6. A method for detecting drop-off of an armature associated with a solenoid, comprising:
 providing, after a hold-in current associated with a solenoid coil has been switched off, a pulsed test voltage to the solenoid coil;
 measuring a current flowing through the solenoid coil;
 switching the pulsed test voltage off when the measured current reaches a predetermined maximum value;
 switching the pulsed test voltage on when the measured current reaches a predetermined minimum value;
 measuring a time period between each pulse associated with the pulsed test voltage;
 comparing the measured time period between pulses; and
 determining, based on the comparison, a drop-off time of an armature associated with the solenoid.

7. The method of claim 6, wherein measuring the time period further includes measuring a time between a falling edge of one pulse and a rising edge of a subsequent pulse.

8. The method of claim 6, wherein measuring the time period further includes measuring a time between the rising and falling edges of each pulse.

9. The method of claim 6, wherein comparing the measured time period between pulses further includes identifying a maximum time period between pulses from among a plurality of measured time periods between pulses.

10. The method of claim 6, wherein the predetermined maximum value includes a current value less and than the minimum hold-in current associated with the solenoid.

11. An armature actuation detection system, comprising:
 a power supply selectively coupled to a solenoid coil via one or more switching elements and configured to provide a voltage output;
 a controller operatively coupled to the one or more switching elements and configured to:
  operate the one or more switching elements to selectively provide a voltage potential to the solenoid coil;
  measure a current flowing through the solenoid coil;
  switch the voltage potential off when the measured current reaches a predetermined maximum value;
  switch the voltage potential on when the measured current reaches a predetermined minimum value;
  measure a time period between pulses of the voltage potential;
  compare the measured time period between pulses with predetermined data indicative of a logarithmic growth characteristic associated with the solenoid coil; and
  determine, based on the comparison, a pull-in time of an armature associated with the solenoid.

12. The system of claim 11, wherein the controller includes an electronic control unit associated with a machine.

13. The system of claim 11, wherein the predetermined data includes data associated with a logarithmic growth associated with the inductance of the solenoid coil over time.

14. The system of claim 11, wherein the predetermined data includes data associated with a logarithmic growth associated with the magnetic field induced by the solenoid coil over time.

15. The system of claim 11, wherein the controller is further configured to determine a pull-in time as a time associated with a maximum deviation of the measured time period between pulses from the predetermined data.

16. The system of claim 11, wherein the controller is further configured to measure the time period between pulses as a time between switching the voltage potential off and switching the voltage potential on.

17. An armature drop-off detection system, comprising:
 a power supply selectively coupled to a solenoid coil via one or more switching elements and configured to provide a voltage output;
 a controller operatively coupled to the one or more switching elements and configured to:
  operate, after a hold-in current associated with a solenoid coil has been switched off, the one or more switching elements to selectively provide a pulsed test voltage to the solenoid coil;
  measure a current flowing through the solenoid coil;
  switch the pulsed test voltage off when the measured current reaches a predetermined maximum value;
  switch the pulsed test voltage on when the measured current reaches a predetermined minimum value;
  measure a time period between each pulse associated with the pulsed test voltage;
  compare the measured time period between pulses; and
  determine, based on the comparison, a drop-off time of an armature associated with the solenoid.

18. The system of claim 17, wherein the controller is further configured to measure the time period as a time between a falling edge of one pulse and a rising edge of a subsequent pulse.

19. The system of claim 17, wherein the controller is further configured to measure the time period as a time between a rising and falling edge associated with each pulse.

20. The system of claim 17, wherein the controller is further configured to compare the measured time period between pulses by identifying a maximum time period between pulses from among a plurality of measured time periods between pulses.

21. The system of claim 17, wherein the predetermined maximum value includes a current value less and than the minimum hold-in current associated with the solenoid.

22. A machine, comprising:
 a solenoid having a conductor and an armature, wherein the conductor is coiled substantially around the armature in a longitudinal direction and separated from the armature via an air gap, the armature being adapted to move relative to the conductor in the presence of an electromagnetic field generated by the conductor;
 an armature drop-off system operatively coupled to the solenoid, the armature drop-off system including:
  a power supply selectively coupled to the solenoid conductor via one or more switching elements and configured to provide a voltage output;
  a controller operatively coupled to the one or more switching elements and configured to:
   operate, after an energizing current associated with a solenoid conductor has been switched off, the one or more switching elements to selectively provide a pulsed test voltage to the solenoid conductor;
   measure a current flowing through the solenoid conductor;

switch the pulsed test voltage off when the measured current reaches a predetermined maximum value;
switch the pulsed test voltage on when the measured current reaches a predetermined minimum value;
measure a time period between each pulse associated with the pulsed test voltage;
compare the measured time period between pulses; and
determine, based on the comparison, a drop-off time of an armature associated with the solenoid.

23. The machine of claim 22, wherein the controller is further configured to measure the time period as a time between a falling edge of one pulse and a rising edge of a subsequent pulse.

24. The machine of claim 22, wherein the controller is further configured to measure the time period as a time between a rising and falling edge of associated with each pulse.

25. The machine of claim 22, wherein the controller is further configured to compare the measured time period between pulses by identifying a maximum time period between pulses from among a plurality of measured time periods between pulses.

26. The machine of claim 22, wherein the predetermined maximum value includes a current value less and than the minimum hold-in current associated with the solenoid.

27. A machine, comprising:
a solenoid having a conductor and an armature, wherein the conductor is coiled substantially around the armature in a longitudinal direction and separated from the armature via an air gap, the armature being adapted to move relative to the conductor in the presence of an electromagnetic field generated by the conductor;
an armature actuation detection system operatively coupled to the solenoid, the armature actuation detection system including:
a power supply selectively coupled to a solenoid conductor via one or more switching elements and configured to provide a voltage output;
a controller operatively coupled to the one or more switching elements and configured to:
operate the one or more switching elements to selectively provide a voltage potential to the solenoid conductor;
measure a current flowing through the solenoid conductor;
switch the voltage potential off when the measured current reaches a predetermined maximum value;
switch the voltage potential on when the measured current reaches a predetermined minimum value;
measure a time period between pulses of the voltage potential;
compare the measured time period between pulses with predetermined data indicative of a logarithmic growth characteristic associated with the solenoid conductor; and
determine, based on the comparison, a pull-in time of an armature associated with the solenoid.

28. The machine of claim 27, wherein the controller includes an electronic control system associated with a machine.

29. The machine of claim 27, wherein the predetermined data includes data associated with a logarithmic growth associated with the inductance of the solenoid coil over time.

30. The machine of claim 27, wherein the predetermined data includes data associated with a logarithmic growth associated with the magnetic field induced by the solenoid coil over time.

31. The machine of claim 27, wherein the controller is further configured to determine a pull-in time as a time associated with a maximum deviation of the measured time period between pulses from the predetermined data.

32. The machine of claim 27, wherein the controller is further configured to measure the time period between pulses as a time between the pulsing the voltage potential off and the pulsing of the voltage potential on.

* * * * *